United States Patent
Benz et al.

(10) Patent No.: US 6,377,049 B1
(45) Date of Patent: Apr. 23, 2002

(54) RESIDUUM RARE EARTH MAGNET

(75) Inventors: Mark Gilbert Benz, Burnt Hills; Juliana Ching Shei, Niskayuna, both of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/248,950

(22) Filed: Feb. 12, 1999

(51) Int. Cl.$^7$ .................................................. G01V 3/00
(52) U.S. Cl. ........................................ 324/319; 148/302
(58) Field of Search ................................ 324/319, 318, 324/300; 148/302, 301, 101, 122, 104; 75/255

(56) References Cited

U.S. PATENT DOCUMENTS

| | | |
|---|---|---|
| 3,524,800 A | 8/1970 | Morrice et al. |
| 3,729,397 A | 4/1973 | Goldsmith et al. |
| 4,597,938 A | 7/1986 | Matsuura et al. ............. 419/23 |
| 4,684,406 A | 8/1987 | Matsuura et al. ............. 75/244 |
| 4,684,448 A | 8/1987 | Itoh et al. ..................... 204/71 |
| 4,689,073 A | 8/1987 | Nate et al. ................... 148/301 |
| 4,747,924 A | 5/1988 | Itoh et al. ................... 204/225 |
| 4,767,455 A | 8/1988 | Jourdan ....................... 75/84.4 |
| 4,837,109 A | 6/1989 | Tokunaga et al. ............. 420/83 |
| 4,865,660 A | 9/1989 | Nate et al. ................ 75/0.5 BA |
| 4,875,946 A | 10/1989 | Heh et al. ................... 148/301 |
| 4,975,130 A | 12/1990 | Matsuura et al. ............ 148/302 |
| 4,983,232 A | 1/1991 | Endoh et al. ................ 148/302 |
| 5,022,939 A | 6/1991 | Yajima et al. ............... 148/302 |
| 5,041,172 A | 8/1991 | Tokunaga et al. ........... 148/302 |
| 5,164,023 A | 11/1992 | Tabaru et al. ............... 148/302 |
| 5,178,692 A | 1/1993 | Panchanathan ............. 148/101 |
| 5,223,047 A | 6/1993 | Endoh et al. ................ 148/302 |
| 5,230,751 A | 7/1993 | Endoh et al. ................ 148/302 |
| 5,281,250 A | 1/1994 | Hamamura et al. ........... 75/255 |
| 5,338,520 A | 8/1994 | Leveque et al. ........... 423/21.1 |
| 5,514,224 A | 5/1996 | Panchanathan ............. 148/104 |
| 6,019,859 A | * 2/2000 | Kanekiyo et al. ........... 148/302 |
| 6,120,620 A | * 9/2000 | Benz et al. ................. 148/302 |
| 6,143,193 A | * 11/2000 | Akioka et al. ............ 252/62.55 |
| 6,168,673 B1 | * 1/2001 | Kanekiyo et al. ........... 148/122 |

FOREIGN PATENT DOCUMENTS

| | | |
|---|---|---|
| CN | 7146 | 8/1990 |
| CN | 1065153 | 10/1992 |
| EP | 498528 A2 | 8/1992 |
| EP | 660129 A1 | 6/1995 |

OTHER PUBLICATIONS

Patent Abstracts: RU2030463; J04011703; 61295355.
European Search Report.

* cited by examiner

*Primary Examiner*—Louis Arana
(74) *Attorney, Agent, or Firm*—Noreen C. Johnson; Christian G. Cabou

(57) ABSTRACT

A permanent magnet for an MRI scanner is made by removing extraneous elements from an ore containing rare earth elements to leave elements Pr and Nd therein, and then selectively stripping therefrom a portion of the element Nd as a byproduct to leave an ore residuum including both elements Pr and Nd therein. The residuum is alloyed with a transition metal to form an alloy therewith. The alloy is then formed into a rare earth permanent magnet configured for use in the MRI scanner.

18 Claims, 3 Drawing Sheets

1

RESIDUUM RARE EARTH MAGNET

BACKGROUND OF THE INVENTION

The present invention relates generally to MRI scanners, and, more specifically, to magnetic field generators therein.

A magnetic resonance imaging (MRI) system or scanner is commonly used for precisely determining structure of organic molecules. A target is placed in an imaging volume or zone under a strong magnetic field and analyzed by the absorption and re-emission of radio frequency-electromagnetic radiation by hydrogen or carbon nuclei. The resonant frequency of this absorption and re-emission is a function of the gyromagnetic ratio of the nuclei and the applied magnetic field.

MRI imaging is a derivative of nuclear magnetic resonance (NMR) spectroscopy used by organic chemists to determine organic molecule structure. In NMR spectroscopy, variations in emission intensity as a function of frequency are used to infer variations in the structure of the organic molecule being examined. These frequency variations are due to variations in the local magnetic field caused by variations in the electronic and molecular structure of the organic molecule.

In MRI imaging, variations in emission intensity as a function of frequency are used to generate an image of the target which is typically a selected portion of a human patient. Frequency is used to encode spatial address information. Variations in local magnetic field are created by a pulsed gradient coil system to give a discrete and slightly different field and corresponding frequency for each volume element in the field of view.

The applied magnetic field for NMR spectroscopy is substantially high, and requires a superconducting magnet. The applied magnetic field for MRI imaging is substantially lower and is typically provided by a superconducting magnet, and more recently by permanent magnets with even lower magnetic field strength.

The use of permanent magnets in the magnetic field generators of an MRI scanner substantially reduces the complexity and cost thereof. And, due to advances in improving resolution and image quality of MRI scanners, performance of permanent magnet-based MRI scanners has been improved.

Nevertheless, the relatively high magnetic field strength required for MRI imaging requires a high performance permanent magnet such as rare earth permanent magnets having magnetic energy densities substantially greater than conventional ferrite magnets for example. The typical high performance permanent magnet for MRI scanners is the sintered rare earth neodymium (Nd), iron (Fe), and boron (B) magnet.

The significant magnetic properties of the permanent magnet for an MRI application include the residual magnetic flux density ($B_r$), coercive force ($H_c$), intrinsic coercive force ($H_{ci}$), and maximum energy product $(BH)_{max}$.

The sintered NdFeB rare earth permanent magnet provides high performance for use in various applications such as the MRI magnetic field generator, as well as for use in various portions of a computer including its hard drive and actuation motors. The composition of the permanent magnet and the sequential processes from mine to finished product are currently optimized for NdFeB to obtain the highest energy product $(BH)_{max}$ and the highest intrinsic coercive force $H_{ci}$.

However, the resulting high performance permanent magnet as used for MRI scanners requires well over a thousand kilograms thereof per scanner which is orders of magnitude greater than the small gram amounts thereof required for a typical computer. Accordingly, the cost of using permanent magnets in an scanner is substantially high which correspondingly limits the practical availability thereof.

The production of permanent magnets for the MRI scanner necessarily begins by initially mining the ore which contains a mixture of various rare earth elements and other miscellaneous elements. The particular rare earth element of interest, such as Nd, must be refined from the basic ore into a substantially pure form greater than about 99%. The rare earth element is then alloyed with separately refined elements such as iron and boron to form an alloy thereof. The alloy in powder form is compacted under pressure in a magnetic field, and heat sintered to form blocks of permanent magnets which are magnetized and assembled in the required configuration for the magnetic field generator of the MRI scanner. The remainder of the scanner is then assembled for cooperating with the permanent magnets.

The resulting cost of the MRI scanner includes in significant part the corresponding high cost to process the rare earth ore for isolating the specific rare earth element followed in turn by alloying the rare earth element with iron and boron to produce the resulting rare earth permanent magnets.

Accordingly, it is desired to reduce the cost of a MRI scanner by reducing the cost of the rare earth permanent magnets therein, and the costs in processing the rare earth elements thereof.

BRIEF SUMMARY OF THE INVENTION

A permanent magnet for an MRI scanner is made by removing extraneous elements from an ore containing rare earth elements to leave elements Pr and Nd therein, and then selectively stripping therefrom a portion of the element Nd as a byproduct to leave an ore residuum including both elements Pr and Nd therein. The residuum is alloyed with a transition metal to form an alloy therewith. The alloy is then formed into a rare earth permanent magnet configured for use in the MRI scanner.

DETAILED DESCRIPTION OF THE INVENTION

Figure 1:
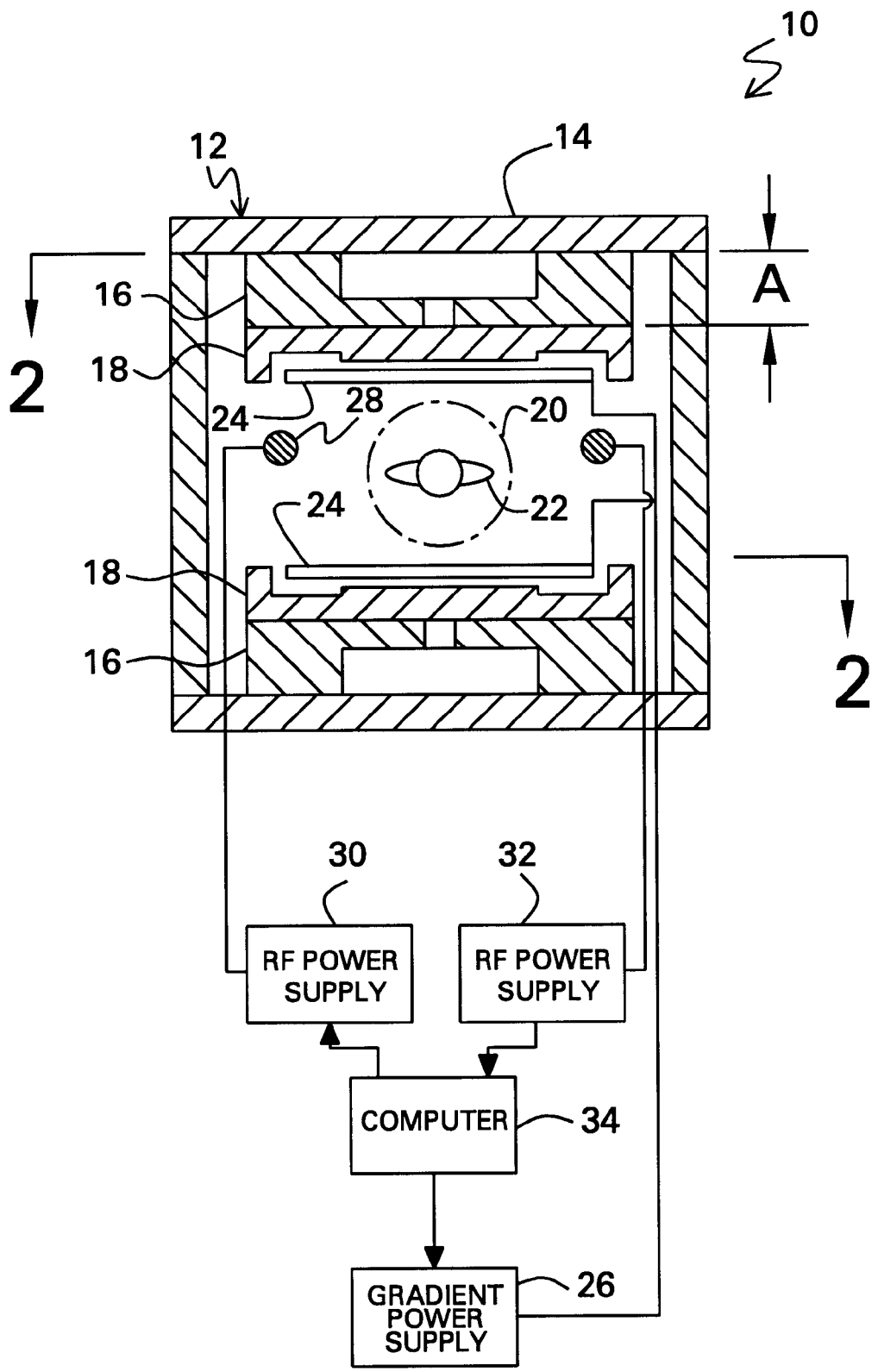
FIG. 1 is a schematic, elevational sectional view through an MRI scanner having rare earth permanent magnets therein in accordance with an exemplary embodiment of the present invention.

Illustrated schematically in FIG. 1 is an MRI imaging system or scanner 10 in accordance with an exemplary embodiment of the present invention. The scanner includes a magnetic field generator 12 including a magnetic yoke 14, an opposing pair of magnetic field generating pads 16 mounted to the yoke and spaced apart from each other, and a pair of cooperating pole pieces 18 disposed adjacent to respective ones of the pads for shaping the magnetic field therefrom in a central imaging volume or zone 20 therebetween.

The magnetic yoke 14 is conventional in configuration and includes iron top and bottom plates against which respective ones of the pads 16 are disposed. The yoke also includes iron side posts joining together the top and bottom plates for providing a magnetic circuit path.

A target 22, such as a human patient, may be positioned within imaging zone 20 for undergoing magnetic resonance imaging of selected regions thereof. The magnetic field generating pads 16 are rare earth permanent magnets in accordance with the present invention, and are configured for producing a substantially uniform magnetic field between the opposing pads 16 and through the imaging zone 20. The uniformity of the magnetic field in the imaging zone 20 is shaped in part by the iron pole pieces 18 in a conventional manner.

A plurality of gradient coils 24 are disposed adjacent to the corresponding pole pieces 18 for locally varying magnetic field in the imaging zone 20. The coils 24 are joined to corresponding gradient power supplies 26. The gradient coils and power supplies therefor may take any conventional form for effecting local magnetic gradient fields in three orthogonal axes XYZ within the imaging zone. The gradient coils are excited by pulses of electrical current from their power supplies to superimpose a slightly different incremental magnetic field in each volume element or voxel being examined in the imaging zone 20 to provide a unique and known field and corresponding frequency address for each voxel.

A radio frequency (RF) coil 28 is disposed around the imaging zone 20 for radiating RF excitation energy therein for exciting hydrogen nuclei in the target 22. A corresponding RF power supply 30 is joined to the RF coil 28 for providing power thereof. An RF receiver 32 is operatively joined with the RF coil 28 for receiving RF signals as the hydrogen nuclei release energy during MRI operation.

A suitable digitally programmable computer 34 is operatively joined to the power supplies 26,30 and receiver 32, and provides means for controlling the MRI system to magnetically resonate the target 22, interpret the signals received from the excited target 22, and create MRI scanning images therefrom in a conventional manner.

But for the rare earth permanent magnet pads 16, the entire MRI scanner 10 may be conventional in configuration and operation for scanning the target 22 in the imaging zone 20. The permanent magnet pads 16 may be made in a new manner, with a correspondingly new composition, for substantially reducing the cost of manufacture of the MRI scanner while maintaining comparable imaging performance including image quality and resolution.

Figure 2:
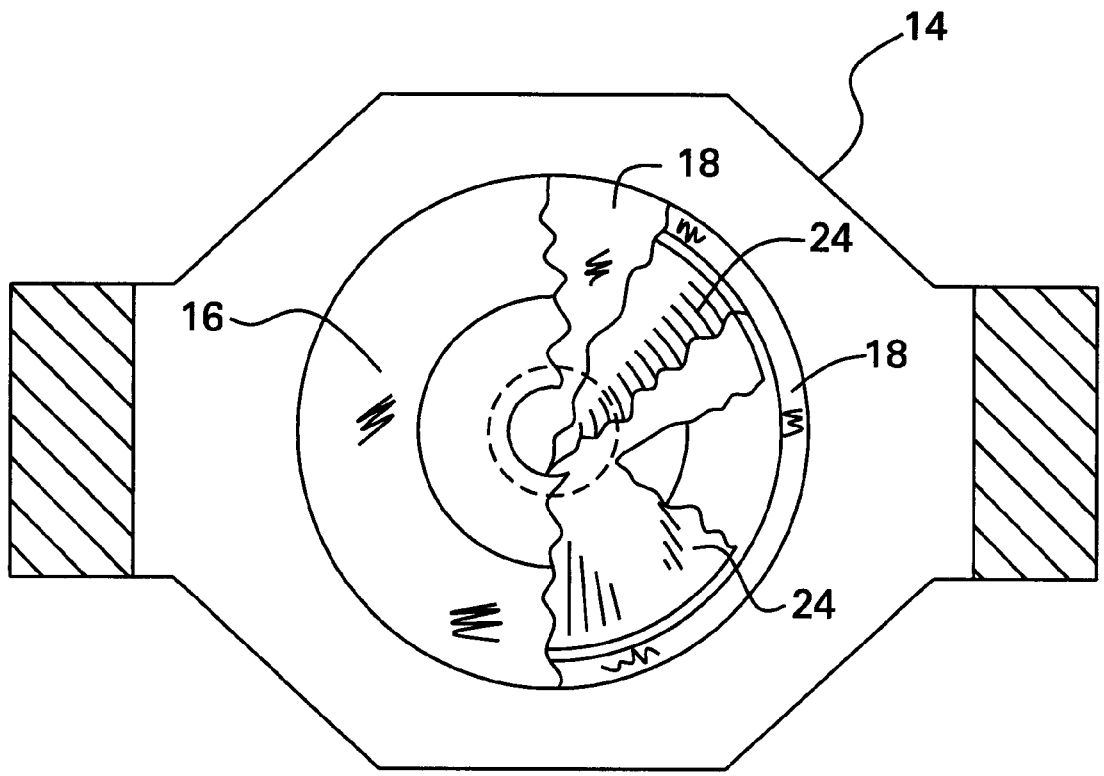
FIG. 2 is a top sectional view through the scanner illustrated in FIG. 1 and taken along jogged line 2—2.

Since the amount of permanent magnet material required in the pads 16 for an individual MRI scanner typically requires thousands of kilograms of material, substantial cost reduction in the scanner may be obtained by correspondingly reducing the cost of making the permanent magnets used therein. Furthermore, the resulting lower cost permanent magnet pads 16 allow for increased volume thereof and further improvements in the configuration thereof as shown in FIGS. 1 and 2 in an exemplary embodiment.

The cost of the MRI scanner may be reduced while maintaining comparable performance thereof, or some of the cost reduction may be offset for further increasing performance of the scanner by increasing uniformity of the applied magnetic field from the permanent magnets.

The permanent magnet pads 16 require a specific configuration and specific composition for being effective in generating a uniform magnetic field across the imaging zone 20 for use in magnetic resonance imaging. Production of the pads, however, includes a substantial number of steps from mining the rare earth containing ore, refining the ore, alloying the resulting metal with a suitable transition metal, and forming rare earth permanent magnets fabricated into the resulting pads 16.

In accordance with the present invention, it has been discovered that the cost of each of the several process steps required for eventually producing the permanent magnet pads 16 tends to be multiplicative with the cost of the preceding steps. If a preceding step is costly, the succeeding steps tend to be correspondingly costly. Accordingly, by reducing the cost of reducing a processing step, costs of succeeding steps may be correspondingly reduced thusly accumulating cost reductions over the entire process for substantial savings in final cost of the MRI scanner.

For example, in the conventional production of rare earth permanent magnets, the individual elements thereof are separately refined to substantially pure form and then precisely alloyed together for controlling the metallurgical composition thereof, metallurgical microstructure thereof, and the resulting magnetic performance thereof. The typical high performance, rare earth permanent magnet found in current MRI scanners uses essentially pure neodymium alloyed with the transition metal iron, and with boron to produce a NdFeB sintered rare earth permanent magnet. Additional, substantially pure elements may also be alloyed into the permanent magnet for improving magnetic properties thereof in a conventional manner.

Although there are several rare earth elements which may be individually used for forming rare earth permanent magnets, neodymium has conventionally offered the highest magnetic performance for use in MRI scanners, as well as for other high performance applications such as those typically associated with computers including the small drive motors used therein. Since the weight of high performance permanent magnets used in a computer application is on the order of grams, the associated high cost therefor is a small contribution to the overall cost of the computer system. However, since an MRI scanner requires thousands of kilograms of high performance permanent magnet material, a correspondingly high cost thereof is a major cost contributor to the overall cost of the scanner.

In accordance with the present invention, an improved process of making the MRI permanent magnets is disclosed for substantially reducing the cost thereof, and the corresponding costs of the MRI scanner itself, while obtaining comparable performance. The improved process results in a different composition of the rare earth permanent magnet, and permits a change in configuration thereof for further improving magnetic field uniformity in the scanner.

Figure 3:
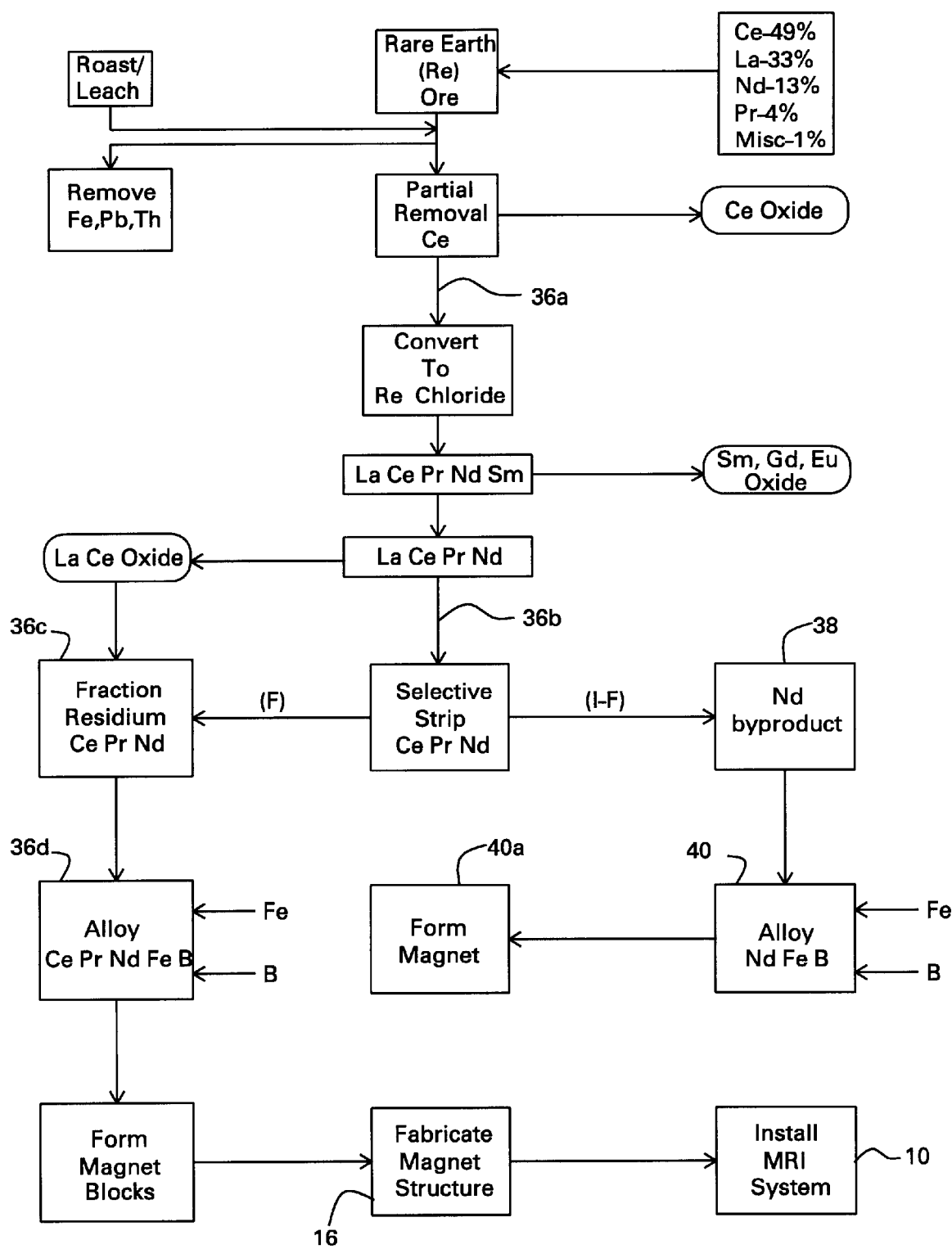
FIG. 3 is a flowchart representation of a method for making the MRI scanner illustrated in FIGS. 1 and 2, including the permanent magnets therein, in accordance with an exemplary embodiment of the present invention.

FIG. 3 illustrates in flowchart form a method or process for making a rare earth permanent magnet 16 configured for use in the MRI scanner 10 of FIG. 1 in accordance with an exemplary embodiment of the present invention. The process starts at the mine from which a suitable ore 36 is provided. The ore typically includes a combination of several rare earth elements including cerium (Ce), lanthanum (La), Nd, and praseodymium (Pr), with miscellaneous secondary elements. In one exemplary composition, the rare earth ore includes 49% Ce, 33% La, 13% Nd, 4% Pr, and the remainder of miscellaneous elements.

The basic steps in processing rare earth containing ore are conventional, and culminate in the production of high purity Nd oxide and high purity Pr oxide separately removed from the ore with purity greater than about 99.9%. This refining process includes many steps and correspondingly high cost for first removing extraneous elements and finally separating the high purity Nd and Pr therefrom.

In accordance with a preferred embodiment, extraneous elements are firstly removed from the ore 36 to leave the elements Ce, Pr, and Nd therein. This may be accomplished using conventional process steps.

For example, the initial ore is processed to separate the extraneous elements therein not required for liberating the desired rare earth elements. The ore may be processed using roasting, leaching, flotation, and solvent extraction, for example, for removing undesired iron, lead (Pb), thorium (Th), samarium (Sm), gadolinium (Gd), and europium (Eu).

In particular, the element Ce is preferably only partially removed from the ore, with the remaining rare earth (Re) elements in the intermediate ore 36a being converted to chloride with a resulting composition of LaCePrNdSm from which are removed oxides of Sm, Gd, Eu. From the resulting mixture of LaCePrNd, the oxide of LaCe is removed leaving an intermediate ore 36b in solution.

Although these process steps are basically conventional, a significant departure therefrom in accordance with a preferred embodiment is the partial removal of cerium, in oxide form, for reducing the cerium component of the rare earth elements in the intermediate mixture 36a to an amount greater than about 0.6%. In conventional practice, substantially all the cerium is removed to an amount less than 0.6% of the rare earth elements so that the resulting refined rare earth elements are substantially pure.

It has been discovered that the separation of cerium from the rare earth elements is a prime contributor to the cost of the rare earth refining. However, the introduction of cerium in the resulting permanent magnet correspondingly reduces the intrinsic coercive force $H_{ci}$ significantly. The rare earth magnet without cerium can achieve a maximum intrinsic coercive force $H_{ci}$ of up to about 15 kOe.

For satisfactory performance of the permanent magnet for the MRI scanner, removal of cerium from the rare earth elements may be limited for maintaining the cerium component of the rare earth elements up to about 10%. At 10% cerium content, the resulting permanent magnet will have an intrinsic coercive force $H_{ci}$ of about 7 kOe.

In a preferred embodiment, however, the element Ce is partially removed from the ore to reduce the cerium component of the rare earth elements to about 5% for achieving an intrinsic coercive force $H_{ci}$ of about 9 kOe, or greater, for obtaining suitable performance of the permanent magnet for the MRI application.

Accordingly, the various extraneous elements are removed from the ore to leave primarily only the elements Ce, Pr, and Nd therein in the intermediate ore 36b. The discovery of retaining this significant component of the element Ce in the intermediate ore, allows a substantial reduction in cost of refining the rare earth elements, while obtaining acceptable magnetic performance.

In accordance with another feature of the present invention, instead of individually removing the rare earth elements Pr and Nd from the intermediate ore to produce substantially pure forms thereof as is conventionally done, only a portion of the rare earth element Nd is selectively stripped from the intermediate ore as a byproduct 38, in oxide form, to leave an ore residuum 36c, in mixed oxide form, including the elements Ce, Pr, and Nd. In the preferred embodiment, the processed ore residuum 36c consists essentially only of the elements Ce, Pr, and Nd.

Of particular significance is that the rare earth element Pr is not individually stripped from the intermediate ore and remains in the residuum 36c. The residuum therefore includes both the rare earth elements Pr and Nd, with only a portion of the element Nd being selectively stripped to form the essentially pure Nd byproduct 38. Accordingly, the residuum 36c includes a fraction F of the element Nd, and the byproduct 38 includes the complement, i.e., 1-F, of the element Nd fraction.

Selective stripping may be accomplished in various conventional processes. For example, the intermediate ore 36b containing CePrNd may be processed in an organic solution from which these elements are collectively stripped by solvent extraction, and precipitated as mixed oxalate or carbonate salts. Stripping of the element Nd may be effected using additional separation or extraction stages to isolate the Nd byproduct.

The resulting CePrNd mixed oxide residuum 36c is therefore depleted of only a portion of its Nd component, which correspondingly increases the relatively percentage of the rare earth element Pr therein.

The mixed oxide residuum is then converted from oxide to metal in any conventional manner, with the mixed rare earth metal residuum being alloyed with a transition metal, such as iron, to form a metal alloy 36d therewith. The residuum alloy 36d is then suitably formed into a mixed rare earth permanent magnet, such as in the form of the permanent magnet pads 16 for MRI scanner.

In the preferred embodiment, the residuum 36c is alloyed with both iron and boron to form a mixed rare earth permanent magnet comprising CePrNdFeB. Additional, substantially pure elements may also be alloyed into the permanent magnet for improving magnetic properties thereof in a conventional manner.

Correspondingly, the substantially pure Nd byproduct 38 may be used for various other purposes such as in computer applications requiring high performance rare earth permanent magnets. The Nd byproduct is converted from oxide to metal and alloyed in any conventional manner with a transition metal, such as iron, and with boron to form an alloy therewith comprising NdFeB. The byproduct alloy 40 is then suitably formed into a unitary rare earth (Nd) permanent magnet 40a for use in a byproduct application requiring high performance rare earth permanent magnets. Additional, substantially pure elements may also be alloyed into the permanent magnet for improving magnetic properties thereof in a conventional manner.

The rare earth permanent magnets of either unitary or mixed rare earth composition may be formed in any conventional manner. For example, the processed rare earth oxides are converted to metal which are typically melted in a vacuum furnace. The resulting metals are crushed, pulverized, and milled in an inert atmosphere such as nitrogen, and jet milled with nitrogen to a micron sized powder. The components of the permanent magnets are suitably mixed and blended to final composition, and subjected to magnetic field alignment for undergoing die or isostatic pressing. The pressed magnet material is then sintered and heat treated in a suitable vacuum or inert gas furnace. The resulting permanent magnetic material is cut or machined to desired size and configuration such as in block form. The blocks are then magnetized and assembled into the required configuration such as the pads 16 for use in the scanner.

Whereas the Nd byproduct 38 may be alloyed with iron and boron to form a high performance NdFeB sintered permanent magnet, the mixed oxide residuum 36c may be alloyed with iron and boron to form a sintered mixed rare earth CePrNdFeB permanent magnet having different composition and magnetic properties. As indicated above, intrinsic coercive force $H_{ci}$ is a significant magnetic property which decreases with increasing cerium content of the permanent magnet. Furthermore, although the rare earth elements Nd Pr are different, the combination thereof in the mixed rare earth permanent magnet does not adversely affect the intrinsic coercive force.

Evaluation of the interrelated effects of the four significant magnetic properties including residual magnetic flux density, coercive force, intrinsic coercive force, and maximum energy product indicates that the nominal amount of cerium as described above, and retention together of the rare earth elements Nd and Pr provide acceptable magnetic performance of the mixed rare earth permanent magnet for the MRI scanner with a significant maximum energy product $(BH)_{max}$ within a range of about 36–40 MGOe.

In the preferred embodiment, the element Nd fraction F in the residuum 36c is less than the element Nd complement (1-F) in the byproduct 38. Preferably, the element Nd fraction F in the residuum and resulting permanent magnet is up to about 0.11 (11%). This fraction is based on a cost analysis wherein the relative cost of the mixed rare earth oxide processing increases nonlinearly with an increase in the element Nd fraction F, with the fraction F equaling 0.11 providing a substantial reduction in cost of the mixed rare earth permanent magnet while achieving a mixed rare earth composition having suitable magnetic properties for use in the MRI scanner.

As indicated above, the substantial reduction in processing cost attributed to not removing all of the cerium from the rare earth ore, and by selectively stripping only a portion of the element Nd from the ore to leave the mixed rare earth residuum provides additional cost reductions in subsequent steps of the manufacturing process leading to the final assembly of the MRI scanner.

The scanner is accordingly manufactured by initially forming the permanent magnet pad 16 in the magnetic field generator 12 from the ore 36 containing rare earth elements including Pr and Nd by selectively stripping therefrom the element Nd as the byproduct 38 to leave the residuum 36c including both elements Pr and Nd therein. The residuum is subsequently alloyed with the transition metal, such as iron, and with boron to form the mixed rare earth permanent magnet.

The permanent magnets are preferably formed in unitary magnet blocks which may be suitably assembled into the pair of magnetic field generator pads 16 on opposite sides of the magnetic yoke 14 illustrated in FIG. 1. The pair of pole pieces 18 are then assembled adjacent to the corresponding pads 16 for shaping the magnetic field therefrom in the imaging zone 20 therebetween.

The gradient coils 24 are assembled adjacent to the respective pole pieces 18 for locally varying the magnetic field in the imaging zone 20. The RF coil 28 is assembled around the imaging zone 20 for radiating excitation energy therein. And, the gradient coils 24 and RF coil 28 are operatively joined to the computer 34 and their corresponding power supplies for magnetically resonating the target 22 in the imaging zone 20 for imaging thereof in a conventional manner.

In the preferred embodiment, the element Ce is partially removed from the rare earth ore prior to the selective stripping process to reduce the Ce component of the rare earth elements to greater than 0.6% and up to about 10%, with about 5% being preferred.

As indicated above, the extraneous elements are removed from the ore 36 prior to selective stripping for leaving primarily only Ce Pr Nd therein from which the single rare earth byproduct 38 and the mixed rare earth residuum are stripped.

In view of the substantial cost reduction associated with the production of the mixed rare earth permanent magnet pads 16, including CePrNdFeB, the configuration of the pads 16 may be economically changed for enhancing performance of the MRI scanner 10. For example, the size and mass of the permanent magnet pads 16 may be increased compared to conventionally sized NdFeB permanent magnet pads for improving performance without a substantial increase in corresponding cost.

As shown in the exemplary embodiment of FIGS. 1 and 2, the pads 16 and pole pieces 18 are annular and coaxially aligned with each other, with the imaging zone 20 being defined centrally therebetween. In conventional practice, the permanent magnet pads would have a substantially constant thickness and cooperate with the specifically configured pole pieces 18 for maximizing the uniformity of the magnetic field extending between the opposing pole pieces and pads. Nevertheless, the applied magnetic field across the imaging zone 20 varies slightly from point to point with about 10–20 parts per million.

In order to further increase the uniformity of the applied magnetic field from the permanent magnet pads 16 with an even smaller variation in parts per million, the pad 16 as illustrated in FIG. 1 is preferably selectively non-uniform in thickness A. Preferably, the pads 16 are thicker at their perimeters than at their middle section for increasing uniformity of the magnetic field in the imaging zone 20. In particular, the axial magnetic field between the opposing pads 16 enjoys increased uniformity along the radial direction.

The actual configuration of the permanent magnet pads 16 may be obtained by conventional multidimensional computer analytical techniques for maximizing the magnetic field uniformity in the imaging zone 20. The cost constraint on fabricating the pads 16 is ameliorated in accordance with the new manufacturing process, thusly allowing an increased amount of permanent magnet material in the pads selectively positioned for further improving MRI imaging.

Correspondingly, the pole pieces 18 may be optimized in configuration for maximizing the uniformity of the applied magnetic field from the corresponding pads 16 within the imaging zone 20. And, additional freedom is obtained in designing the pole pieces 18 to cooperate both with the pads 16 and the gradient coils 24.

The selective strip process described above for forming sintered, mixed rare earth permanent magnets produces high performance magnets for the MRI scanner as well as substantially pure Nd byproduct for use in other high performance magnet applications requiring considerably less material weight. Retention of the rare earth cerium component in the resulting permanent magnet substantially reduces cost of the manufacturing process without adversely compromising magnetic performance. Selectively stripping the element Nd to leave the mixed rare earth residuum results in a mixed rare earth permanent magnet economically obtained without the need for alloying substantially pure rare earth elements separately refined in expensive processes.

While there have been described herein what are considered to be preferred and exemplary embodiments of the present invention, other modifications of the invention shall be apparent to those skilled in the art from the teachings herein, and it is, therefore, desired to be secured in the appended claims all such modifications as fall within the true spirit and scope of the invention.

Accordingly, what is desired to be secured by Letters Patent of the United States is the invention as defined and differentiated in the following claims in which we claim:

1. A method of making a permanent magnet comprising:
   providing ore containing rare earth elements including Ce, Nd, and Pr;
   partially removing said element Ce from said ore;
   removing extraneous elements from said ore to leave elements Ce, Pr, and Nd therein;
   selectively stripping from said ore a portion of said element Nd as a byproduct to leave an ore residuum including elements Ce, Pr, and Nd;
   alloying said residuum with a transition metal to form an alloy therewith; and
   forming said residuum alloy into a mixed rare earth permanent magnet.

2. A method according to claim 1 wherein said element Pr is not stripped from said ore and remains in said residuum.

3. A method according to claim 2 wherein said residuum includes a fraction of said element Nd, and said byproduct includes the complement of said element Nd fraction.

4. A method according to claim 2 further comprising:
   alloying said byproduct with a transition metal to form an alloy therewith; and
   forming said byproduct alloy into a unitary rare earth permanent magnet.

5. A method according to claim 4 wherein said transition metal is iron, and both said residuum and byproduct are alloyed with both iron and boron to respectively form CePrNdFeB and NdFeB rare earth permanent magnets.

6. A method according to claim 3 wherein said element Ce is partially removed from said ore to reduce said Ce component of said rare earth elements to greater than about 0.6%.

7. A method according to claim 6 wherein said element Ce is partially removed from said ore to reduce said Ce component of said rare earth elements to less than about 10%.

8. A method according to claim 6 wherein said element Ce is partially removed from said ore to reduce said Ce component of said rare earth elements to about 5%.

9. A method according to claim 3 wherein said element Nd fraction in said residuum is less than said element Nd complement in said byproduct.

10. A method according to claim 9 wherein said element Nd fraction in said residuum is up to about 0.11 in value.

11. A method according to claim 3 further comprising forming said permanent magnet into a pair of magnetic field generator pads configured for a magnetic resonance imaging scanner.

12. A method according to claim 11 further comprising:
    mounting said permanent magnet pads to a magnetic yoke spaced apart from each other; and
    mounting respective pole pieces adjacent to said pads for shaping magnetic field in an imaging zone therebetween.

13. A method according to claim 12 wherein said pads and pole pieces are annular and coaxially aligned, and said pads are thicker at perimeters thereof for increasing uniformity of said magnetic field in said imaging zone.

14. A method according to claim 13 further comprising:
    mounting a plurality of gradient coils adjacent to said pole pieces for locally varying said magnetic field in said imaging zone;
    mounting an RF coil 28 around said imaging zone for radiating excitation energy therein; and
    operatively joining said gradient coils and RF coil to a computer for magnetically resonating a target in said imaging zone for imaging thereof.

15. A method of making a permanent magnet comprising:
    removing extraneous elements from ore containing rare earth elements to leave elements Pr and Nd therein;
    selectively stripping from said ore a portion of said element Nd as a byproduct to leave an ore residuum including both elements Pr and Nd therein;
    alloying said residuum with a transition metal to form an alloy therewith; and
    forming said residuum alloy into a mixed rare earth permanent magnet.

16. A method according to claim 15 further comprising:
    alloying said byproduct with a transition metal to form an alloy therewith; and
    forming said byproduct alloy into a unitary rare earth permanent magnet.

17. A method according to claim 16 wherein said transition metal is iron, and both said residuum and byproduct are alloyed with both iron and boron to respectively form CePrNdFeB and NdFeB rare earth permanent magnets.

18. A method according to claim 16 wherein said element Ce is partially removed from said ore to reduce said Ce component of said rare earth elements to greater than about 0.6%.

* * * * *

UNITED STATES PATENT AND TRADEMARK OFFICE
CERTIFICATE OF CORRECTION

PATENT NO. : 6,377,049 B1  Page 1 of 1
DATED : April 23, 2002
INVENTOR(S) : Mark G. Benz and Juliana C. Shei It is certified that error appears in the above-identified patent and that said Letters Patent is hereby corrected as shown below:

<u>Title page,</u>
Item [75], please correct the spelling of the second named inventor as follows: Cancel "Juliana Ching Shei" and substitute -- Juliana Chiang Shei --.

Signed and Sealed this

Eighteenth Day of June, 2002

*Attest:*

*Attesting Officer*

JAMES E. ROGAN
*Director of the United States Patent and Trademark Office*